(12) United States Patent
Farley (10) Patent No.: US 7,659,843 B2
(45) Date of Patent: Feb. 9, 2010

(54) DIGITIZING AN ANALOG SIGNAL, AND RECONSTITUTING AN ANALOG SIGNAL FROM A DIGITIZED VERSION OF THE ANALOG SIGNAL

(76) Inventor: Richard Andrew Farley, #304 - 975 E. Broadway St., Vancouver B.C. (CA) V5T 1Y3

( * ) Notice: Subject to any disclaimer, the term of this patent is extended or adjusted under 35 U.S.C. 154(b) by 0 days.

(21) Appl. No.: 12/107,044

(22) Filed: Apr. 21, 2008

(65) Prior Publication Data
US 2008/0258953 A1 Oct. 23, 2008

Related U.S. Application Data

(60) Provisional application No. 60/925,364, filed on Apr. 19, 2007.

(51) Int. Cl.
*H03M 1/12* (2006.01)
(52) U.S. Cl. .................................. 341/155; 341/144
(58) Field of Classification Search ................. 341/144, 341/155, 157
See application file for complete search history.

(56) References Cited

U.S. PATENT DOCUMENTS 5,424,735 A * 6/1995 Arkas et al. ................. 341/157
6,064,328 A * 5/2000 Scheidig et al. ............. 341/155
2003/0118199 A1 * 6/2003 Marquis et al. ............... 381/79

* cited by examiner

*Primary Examiner*—Khai M Nguyen
(74) *Attorney, Agent, or Firm*—Graybeal Jackson LLP; Bryan A. Santarelli (57) ABSTRACT

An embodiment of an audio-signal digitizer includes a modulator and a converter. The modulator is operable to receive an analog audio signal, and is operable to angle modulate a carrier signal with the analog audio signal to generate a modulated analog signal having an average amplitude. The converter is operable to convert the modulated analog signal into a digital signal having a first level in response to the modulated signal having an amplitude larger than approximately the average amplitude and having a second level in response to the modulated signal having an amplitude smaller than approximately the average amplitude. Because such a digitizer uses angle modulation to digitize an analog audio signal, the resulting digital audio signal may retain higher frequencies of the analog audio signal than a digital audio signal obtained by amplitude sampling would retain. And the retaining of higher frequencies may introduce less distortion into the reconstituted audio and acoustic signals.

48 Claims, 6 Drawing Sheets

DIGITIZING AN ANALOG SIGNAL, AND RECONSTITUTING AN ANALOG SIGNAL FROM A DIGITIZED VERSION OF THE ANALOG SIGNAL

CLAIM OF PRIORITY

This application claims priority to U.S. Provisional Application Ser. No. 60/925,364, filed on Apr. 19, 2007, which is incorporated by reference.

BACKGROUND

An electronic system with audio capability may generate an acoustic signal to which a human may listen. For example, a television may generate an acoustic signal that includes the voices of people in a scene, and that includes other sounds (e.g., a car horn, a slamming door) associated with the scene. And an MP3 player may generate an acoustic signal that includes instrumentals and vocals. An acoustic signal typically includes frequencies that are within a range of approximately 10 Hz-25 KHz, which is considered to be the approximate range of frequencies that a normal human ear is able to perceive.

Such an electronic system typically generates an acoustic signal from an analog electronic audio signal having the same frequency content as the acoustic signal, and having an amplitude proportional to the amplitude of the acoustic signal (typically the system amplifies the audio signal to generate the acoustic signal).

Although direct sources (e.g., a microphone) of analog audio signals exist, in many applications an analog audio signal is stored for subsequent playback. For example, a production company may record a television show in a studio, and store the resulting audio and video signals on magnetic tape or on a digital versatile Disk (DVD) for subsequent playback; and, a band may record music in a studio, and store the resulting audio signal in an electronic file or on a CD for subsequent playback.

Analog audio signals, are typically stored in digital form, i.e., as a file of digital values. Storing an analog audio signal in digital form may provide advantages such as allowing easy copying of the digital file without degradation of the played-back acoustic signal, allowing electronic transfer of the digital file (e.g., over the internet), reducing the amount of noise added to the stored analog audio signal during the storing process, and allowing use of a higher-density storage medium (e.g., a CD vs. a vinyl LP).

The overwhelming majority of today's electronic systems with the ability to receive and store an analog audio signal do so by sampling the amplitude of the analog audio signal and converting the samples into respective digital values.

Figure 1A:
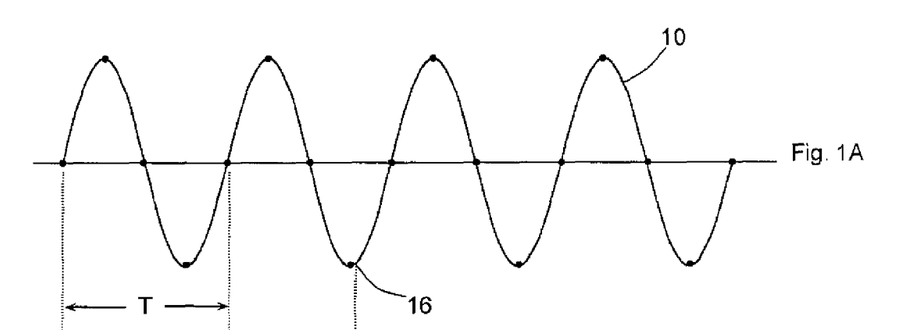
FIG. 1A is timing diagram of a conventional analog audio signal.

FIG. 1A is a timing diagram of an original analog audio signal 10 (here a sinusoid, which represents an acoustic pure tone) having a frequency F and period T=1/F.

Figure 1B:
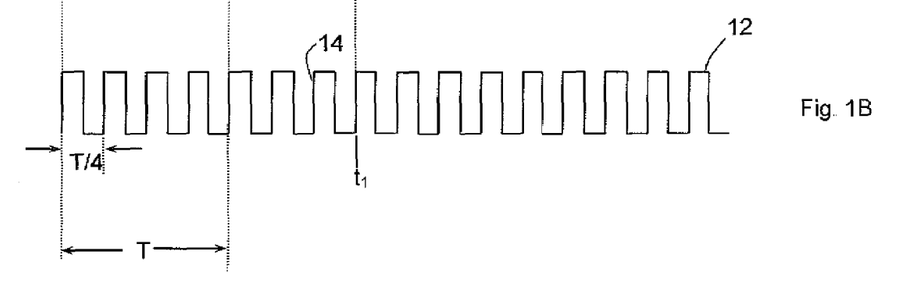
FIG. 1B is a timing diagram of a conventional sampling clock used to sample the amplitude of the analog audio signal of FIG. 1A.

FIG. 1B is a timing diagram of a sampling clock 12 having a frequency $F_s$=4F and a period $$T_s = \frac{T}{4}$$

Referring to FIGS. 1A and 1B, at each rising edge 14 of the clock 12, a circuit (not shown in FIGS. 1A and 1B) samples the instantaneous amplitude of the analog audio signal 10, and holds this sampled amplitude until the next rising edge of the clock. For example, at a time $t_1$, the circuit samples and holds the amplitude of the signal 10 at a point 16.

Next, an analog-to-digital converter (ADC) (not shown in FIGS. 1A-1B) converts the sampled amplitude into a corresponding digital value, for example a twenty-four bit binary number. This digital value represents the digitized amplitude of the analog audio signal 10 at the point 16.

Then, an electronic memory or other storage device (not shown in FIGS. 1A-1B) stores this digital value on a digital storage medium as part of a digital audio file.

The sample-and-hold circuit, the ADC, and the memory (none shown in FIGS. 1A-1B) continue this procedure until the entire signal 10 is digitized, and the resulting digital values are stored on the storage medium as part of the digital audio file.

An audio playback system may then reconstitute the original audio signal 10 and playback a resulting acoustic signal by streaming the stored digital values to a digital-to-analog converter (DAC) (not shown in FIGS. 1A-1B), which generates the reconstituted audio signal, and by then providing the reconstituted audio signal to a transducer (e.g., a speaker), which converts the reconstituted audio signal into the resulting acoustic signal.

Unfortunately, the above-described amplitude sampling technique may introduce distortion and other undesirable artifacts into the reconstituted audio signal, and thus into the resulting acoustic signal.

For example, still referring to FIGS. 1A-1B, jitter in the sampling clock 12 may introduce distortion into the reconstituted audio signal, and thus may introduce distortion into the resulting acoustic signal. Because jitter is a form of noise, and is thus random and unpredictable, the durations between the sampling edges of the sampling clock 12 are likely to be different than the durations between the corresponding edges of the DAC clock (not shown in FIGS. 1A-1B), which ideally has the same frequency and phase (relative to the analog audio signal 10) as the sample clock; and jitter in the DAC clock may exacerbate this problem. Therefore, the DAC may generate the points 16 of the reconstituted audio signal at different positions relative to the original audio signal 10. Consequently, the amplitude of the reconstituted audio signal may be distorted relative to the amplitude of the original audio signal 10, and this distortion may cause noticeable distortion, and thus a noticeable loss of fidelity, in the resulting acoustic signal.

Furthermore, according to Nyquist's theorem, the frequency $F_s$ of the sampling clock 12 must be at least twice the highest frequency in the original audio signal 10. If the audio signal 10 contains frequencies that are higher than $F_s/2$, a phenomenon called aliasing may occur, and aliasing may introduce aliasing distortion into the reconstituted audio signal, and thus into the resulting acoustic signal.

Many of today's audio systems that digitize analog audio signals according to the above-described amplitude-sampling technique use a sampling clock having a frequency $F_s$ of 44.1 KHz.

To limit aliasing, before an audio system samples an analog audio signal it typically filters the audio signal to remove all frequencies above 22.05 KHz (44.1 KHz/2). Therefore, this filtering preserves all but the highest frequencies in the audio-frequency range of approximately 10 Hz-25 KHz.

But even though this filtering may limit the introduction of aliasing distortion into the reconstituted audio signal and into the resulting acoustic signal, this filtering may introduce other types of distortion into these signals.

For example, this filtering may introduce Tartani distortion into the reconstituted audio signal and into the resulting acoustic signal.

It is theorized that the human ear processes audio signals in a non-linear manner. For example, if frequencies $f_1$ and $f_2$ occur simultaneously in an acoustic signal, then the human ear may perceive not only the frequencies $f_1$ and $f_2$, but may also perceive the sum $(f_1+f_2)$ and difference $(|f_2-f_1|)$ frequencies. These sum and difference frequencies are often called Tartani tones, which are named after their discoverer. The most noticeable of the Tartani tones is often the difference frequency $|f_2-f_1|$. Because, in the above example, the anti-aliasing filter cuts out all frequencies above 22.05 KHz, some of the natural Tartani frequencies that a human ear may have perceived in the original acoustic signal may not be perceivable in the resulting acoustic signal generated from the reconstituted audio signal. For example, suppose that the original acoustic signal is music from a live band, and the band's drummer crashes a symbol to produce simultaneous frequencies at 10 KHz, 20 KHz, and 25 KHz. Because the anti-aliasing filter cuts out the 25 kHz frequency from the original analog audio signal prior to its being sampled, this 25 KHz frequency is not present in the reconstituted audio signal, and, therefore, is not present in the resulting acoustic signal. Consequently, the Tartani frequencies at 15 kHz (25 KHz-10 KHz) and at 5 kHz (25 KHz-20 KHz), which were perceivable in the original acoustic signal, are not perceivable in the resulting acoustic signal. Therefore the absence of these Tartani frequencies causes Tartani distortion in the resulting acoustic signal.

One potential technique for reducing or eliminating Tartani distortion in the resulting acoustic signal is to use a sampling frequency that is greater than 44.1 KHz.

But increasing the sampling frequency may increase the cost and complexity of an audio system, and may also be impractical for other reasons. For example, increasing the sampling frequency may increase the complexity and cost of the sample-and-hold circuit and ADC. Furthermore, many of today's audio players, including CD players, DVD players, and MP3 players, are designed for digital audio files generated using a 44.1 KHz sampling clock. Consequently, increasing the industry-standard sampling frequency of 44.1 KHz may render current audio players obsolete in favor of new audio players designed for the increased sampling frequency.

SUMMARY

In an embodiment, an audio-signal digitizer operable to digitize an analog audio signal includes a modulator and a converter. The modulator is operable to receive the audio signal, and is operable to angle modulate a carrier signal with the audio signal to generate a modulated analog signal having an average amplitude. The converter is operable to convert the modulated analog signal into a digital audio signal having a first level in response to the modulated signal having an amplitude larger than approximately the average amplitude and having a second level in response to the modulated signal having an amplitude smaller than approximately the average amplitude.

Because such a digitizer uses angle modulation to digitize an analog audio signal, the resulting digital audio signal may retain higher frequencies of the analog audio signal than a digital audio signal obtained by amplitude sampling would retain. And the retaining of higher frequencies may reduce or eliminate Tartani or other types of distortion in an acoustic signal that is reconstituted from the digitized audio signal.

Furthermore, the use of such a digitizer to digitize analog audio signals may not render today's audio playback equipment obsolete. For example, higher-quality audio playback equipment may be introduced to preserve the fidelity retained by a digital audio signal generated with the above-described digitizer, but such a higher-qualify digital audio signal may also be converted into a lower-quality digital audio signal that is compatible with audio equipment designed for playback of amplitude-sampled digital audio signals.

In another embodiment, an audio reconstituting circuit reconstitutes an analog audio signal from a digital audio signal generated with the above-described digitizer, where the reconstituted analog audio signal, and, therefore, the corresponding resulting acoustic signal, may exhibit lower distortion and have a higher frequency content than an audio signal reconstituted from an amplitude-sampled digital audio signal, and the resulting acoustic signal, respectively.

DETAILED DESCRIPTION

Figure 2:
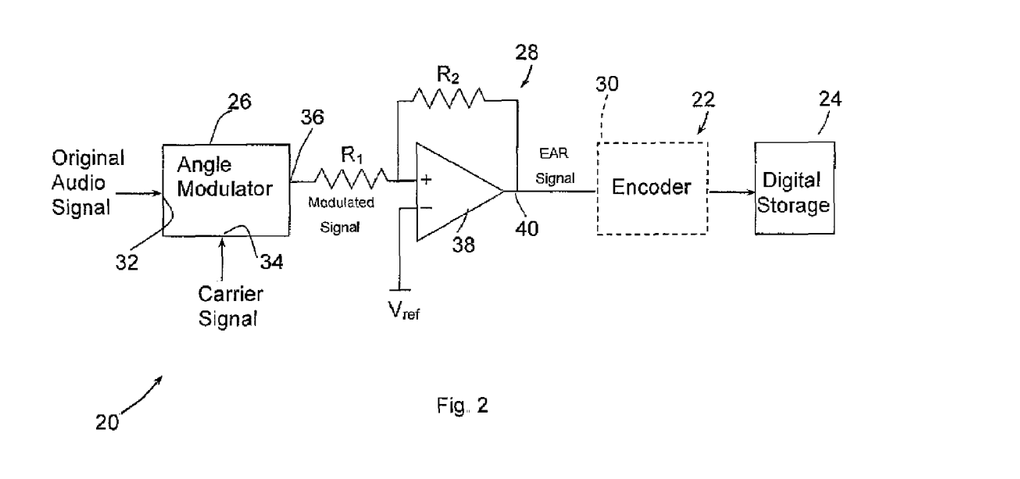
FIG. 2 is a schematic block diagram of an audio system for digitizing an analog audio signal and storing the resulting digital audio signal according to an embodiment of the invention.

FIG. 2 is a schematic block diagram of an audio system 20 for digitizing an analog audio signal according to an embodiment of the invention. As discussed below, the audio system 20 may be more immune to clock jitter than an amplitude-sampling audio system. Furthermore, because the system 20 modulates an analog audio signal before digitizing it, the resulting digital audio signal may retain more of the frequency content of the analog audio signal than a digital audio signal obtained by amplitude sampling. Consequently, this higher immunity to clock jitter and increased frequency content may allow for a resulting acoustic signal of higher fidelity than a digital audio signal obtained by amplitude sampling allows.

The system 20 includes a digitizing circuit 22 and a digital storage device 24.

The digitizing circuit 22 includes an angle modulator 26, a converter 28, and an optional encoder 30.

The angle modulator 26 receives an original audio signal at an audio input node 32, receives an optional carrier signal at a carrier input node 34, and provides an angle-modulated signal at an output node 36. A conventional device such as a microphone, pickup, amplifier or, synthesizer (not shown in FIG. 2) may generate the original audio signal, the carrier signal may be a sinusoid, and the modulator 26 may frequency modulate or phase modulate the carrier signal with the original audio signal. In an embodiment where the modulator 26 frequency modulates the carrier signal, the modulator includes a voltage-controlled oscillator (VCO) that: 1) has a center frequency $F_c$ (the frequency of the VCO when the amplitude of the audio signal is at its average value, which may be zero) at least ten times the highest frequency of the original audio signal, 2) generates a maximum frequency $F_c + F_{maxdev}$ in response to the highest amplitude of the original audio signal, and 3) generates a minimum frequency $F_c - F_{maxdev}$ in response to the lowest amplitude of the original audio signal. The relationship between the amplitude of the audio signal and the frequency deviation of the carrier frequency is called the modulation index, which may be set to any suitable value. For example, $F_c = 1$ MHz, $F_{maxdev} = 125$ KHz, and the highest frequency of the original audio signal is 25 KHz; consequently, the modulated signal at the output node 36 has an instantaneous frequency that ranges from approximately 0.875 MHz-1.125 MHz. Furthermore, because the center frequency $F_c$ of the VCO is effectively the carrier frequency, the modulator 26 may omit the carrier input node 34 and operate without receiving a carrier signal that is separate from the VCO.

The converter 28 includes a comparator 38, which generates from the modulated signal an Encoded Aperiodic Rectangular (EAR) digital audio signal at an output node 40. The comparator 38 receives at a non-inverting node the modulated signal from the modulator 26, and receives at an inverting node a reference voltage $V_{ref}$, which is approximately equal to the DC voltage level (i.e., the average voltage level) of the modulated signal at the non-inverting node. For example, if the modulated signal is coupled to the non-inverting node via a DC blocking capacitor (not shown in FIG. 2), then $V_{ref} = 0$ V because the DC level of the modulated signal is 0 V at the non-inverting node of the comparator 38. Therefore, when the modulated signal at the non-inverting node has an amplitude higher than $V_{ref}$ (i.e., the modulated signal at the non-inverting node has a positive amplitude relative to $V_{ref}$), the comparator 38 generates the EAR signal having a high signal level (a voltage level $V_H$ in this embodiment). And when the modulated signal at the inverting node has an amplitude less than $V_{ref}$ (i.e., the modulated signal at the non-inverting node has a negative amplitude relative to $V_{ref}$), the comparator 38 generates the EAR signal having a low signal level (a voltage level $V_L$ in this embodiment). Consequently, the EAR signal is a rectangular signal having rising edges that respectively correspond to the ascending "zero" crossings of the modulated signal, and having falling edges that respectively correspond to the descending "zero" crossings of the modulated signal—"zero" is in quotes because "zero crossing" refers to the times when the amplitude of the modulated signal at the non-inverting node is equal to $V_{ref}$, which may be, but need not be, 0 V. As discussed below, because the modulator 26 generates an angle-modulated signal, and because the zero crossings of the modulated signal represent the angle (i.e., the phase) of the modulated signal, the EAR signal includes substantially all of the information needed to reconstitute the original audio signal.

Optional circuit components, here resistors $R_1$ and $R_2$, may be coupled to the comparator 38 to generate positive-feedback hysteresis, which may increase the noise immunity of the comparator in a conventional manner. That is, this hysteresis may reduce or eliminate noise-induced jitter in the edges of the EAR signal.

The optional encoder 30 converts the durations of the periods between consecutive edges of the EAR signal into respective digital values. Converting these durations to digital values may facilitate storage of the EAR signal. For example, the encoder may be a counter that is reset by a first edge of the EAR signal, and then counts until the next edge of the EAR signal, where the resulting count value represents the duration between the two edges, and where the resolution of the conversion is proportional to the frequency of the counter clock.

The digital storage device 24 may store the EAR signal directly, or may store the digital values generated by the encoder 30 when the encoder is present and functioning. The digital storage device 24 may be a conventional device, such as an electronic memory (e.g., RAM, ROM, EEPROM), a tape drive, a magnetic-disc drive, or an optical-disc drive, and may store the EAR signal or corresponding digital values on a medium such as magnetic tape, a magnetic disc (e.g., a hard disc), or an optical disc (e.g., a CD or DVD).

Still referring to FIG. 2, alternate embodiments of the audio system 20 are contemplated. For example, although not shown, the system 20 may include a source of the original audio signal. Furthermore, where the DC level of the modulated signal at the non-inverting node of the comparator 38 is 0 V, the comparator circuit 28 may include or be replaced with a series combination of one or more inverters such as a Schmidt Trigger.

Figure 3A:
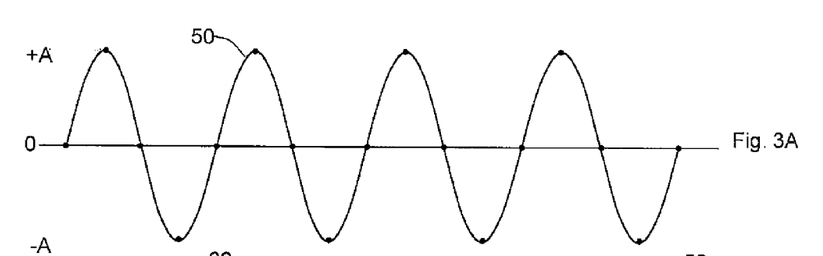
FIGS. 3A-3C are timing diagrams of signals at respective nodes of the audio system of FIG. 2 according to an embodiment of the invention.

FIG. 3A is a timing diagram of an original audio signal 50 (here a sinusoid) at the modulator input node 32 of FIG. 2 according to an embodiment of the invention.

Figure 3B:
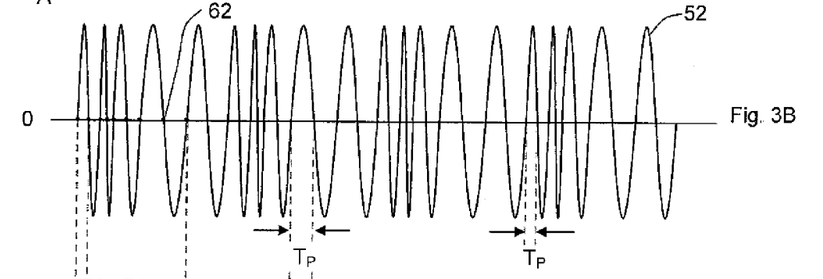

FIG. 3B is a timing diagram of a modulated carrier signal 52 at the non-inverting node of the comparator 38 of FIG. 2 according to an embodiment of the invention.

Figures 3C, 3D:
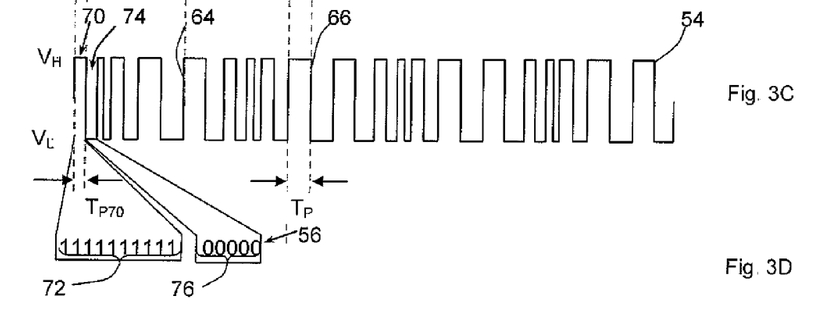
FIGS. 3D-3F are respective streams of digital values generated by the optional encoder of FIG. 2 to represent the digital audio signal of FIG. 3C according to an embodiment of the invention.

FIG. 3C is a timing diagram of an EAR signal 54 at the node 40 (the output of the comparator 38) of FIG. 2 according to an embodiment of the invention.

Figure 3E:
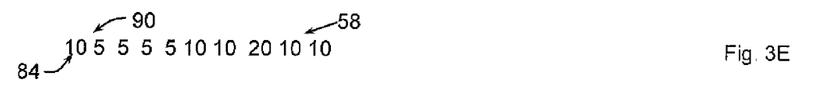
Figure 3F:
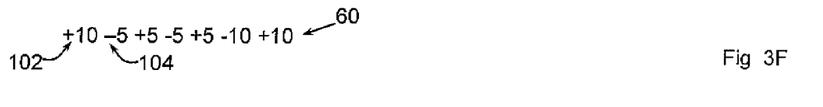

FIGS. 3D-3F are respective streams 56, 58, and 60 of digital values generated by the encoder 30 of FIG. 2 according to an embodiment of the invention.

Figure 4:
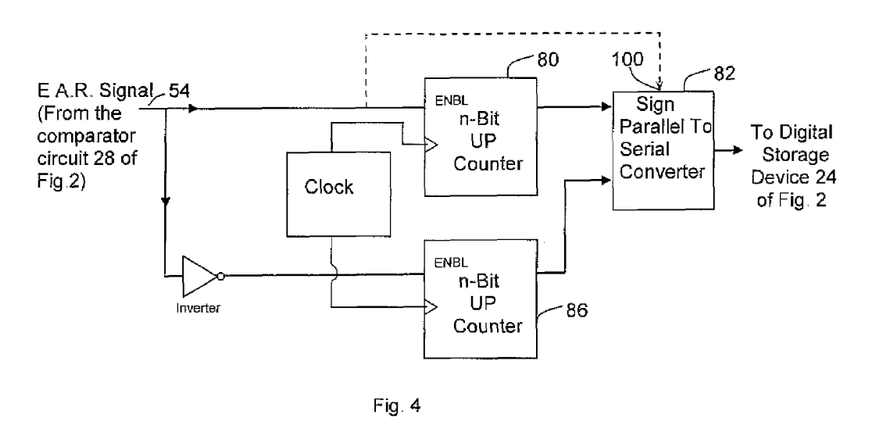
FIG. 4 is a schematic block diagram of the encoder of FIG. 2 according to an embodiment of the invention.

FIG. 4 is a schematic block diagram of the encoder 30 of FIG. 2, where the encoder is operable to generate the streams 58 and 60 of FIGS. 3E and 3F according to an embodiment of the invention.

Referring to FIGS. 2-3F, the operation of the audio system 20 is described according to an embodiment of the invention. For example purposes, the original audio signal 50 is a sinusoid having a frequency in the range of approximately 10 Hz -25 KHz and having a DC level of 0 V, the angle modulator 26 frequency modulates the original audio signal with a sinusoidal carrier signal having a frequency of 1 MHz and generates the modulated signal 52 having a DC level of 0 V, and the encoder 30 includes a counter having a clock frequency of 20 MHz. Furthermore, when the audio signal 50 has a maximum amplitude +A, the modulated signal 52 has a frequency of 1.125 MHz, and when the audio signal has a minimum amplitude −A, the modulated signal has a frequency of 0.875 MHz. Moreover, the signals in FIGS. 3A-3C may not be drawn to scale.

Referring to FIGS. 3A-3B, the frequency of the modulated signal 52 is linearly proportional to the amplitude of the original audio signal 50. That is, the higher the amplitude of the audio signal 50, the higher the frequency of the modulated signal 52, and the lower the amplitude of the audio signal, the lower the frequency of the modulated signal. Consequently, the time periods $T_P$ between consecutive zero crossings 62 of the modulated signal 52 are inversely proportional to the amplitude of the audio signal 50. That is, the higher the amplitude of the audio signal 50, the shorter the time periods $T_P$, and the lower the amplitude of the audio signal, the longer the time periods $T_P$.

Referring to FIGS. 3B-3C, the rising and falling edges 64 and 66 of the EAR signal 54 are aligned with the zero crossings 62 of the modulated signal 52—although the edges 64 and 66 may be time shifted relative to the zero crossings 62 due to e.g., circuit delays, as long as every edge 64 and 66 is shifted substantially the same time relative to its corresponding zero crossing 62, then the following analysis, which assumes that the edges 64 and 66 are aligned with the zero crossing 62, applies.

Furthermore, when the amplitude of the modulated signal 52 is greater than 0 V, the EAR signal 54 has an amplitude of $V_H$, and when the amplitude of the modulated signal is less than 0 V, the EAR signal has an amplitude of $V_L$. Therefore, the EAR signal 54 is in phase with the modulated signal 52.

$V_H$ and $V_L$ may be any standard logic voltage levels, such as 1.8 V and 0 V, respectively.

Referring to FIGS. 3A-3C, because the amplitude of the original audio signal 50 is linearly proportional to the frequency, and thus to the durations $T_P$, of the modulated signal 52, and because the EAR signal 54 preserves the durations $T_P$, one can reconstitute the original audio signal from the EAR signal. And even in non-ideal circumstances (e.g., the edges 64 and 66 are not perfectly aligned with the zero crossings 62), the EAR signal 54 may preserve significantly more frequency content, and have significantly lower levels of distortion, than a sampled-amplitude digital audio signal such as discussed above in conjunction with FIG. 1. Furthermore, because the instantaneous amplitude of the audio signal 50 is "stored" solely in the durations $T_P$ of the EAR signal 54, the actual values of the levels $V_H$ and $V_L$ are irrelevant. And because the actual levels of $V_H$ and $V_L$ are irrelevant, amplitude noise on the audio signal 50 may introduce less distortion into the EAR signal 54 than such amplitude noise introduces into a sampled-amplitude audio signal.

Referring to FIGS. 3C-3D, in an embodiment, each digital value in the stream 56 includes a logic value corresponding to the voltage level of the EAR signal 54. For example, for a first portion 70 of the EAR signal 54 having the level $V_H$, the corresponding digital value 72 in the stream 56 is a logic 1, or a sequence of logic 1's, where the length of the sequence is proportional to the duration $T_{P70}$. As an example, the storage device 24 (FIG. 2) may store a single logic 1 along a length of media corresponding to the period $T_{P70}$. And if the voltage level $V_H$ from the converter 28 is compatible with the storage device 24, then the node 40 may be coupled directly to the storage device. Alternatively, if the storage device 24 has a read/write clock (not shown in FIG. 3) having a frequency that is x times the carrier frequency $F_c$ used to generate the EAR signal 54, and $T_{P70}=1/F_c$, then the digital value 72 includes a sequence of x consecutive logic 1's (in the illustrated example, x=10, so the digital value 72 comprises ten consecutive logic 1's). Similarly, for a second portion 74 of the EAR signal 54 having the level $V_L$, the corresponding digital value 76 in the stream 56 includes a sequence of one or more logic 0's. If, for example, $T_{P74}$ is half as long as $T_{P70}$, in a clocked storage device 24, the value 76 comprises x/2 (here, five) logic value 0's. An advantage of this embodiment is that the digital values in the stream 56 inherently indicate the phase of the EAR signal 54 (e.g., logic 1 indicates positive phase, logic 0 indicates negative phase).

Referring to FIGS. 3C, 3E, and 4, in an embodiment, each digital value in the stream 56 includes a number that indicates the length of the period $T_P$ between each consecutive pair of edges 64 and 66 of the EAR signal 54.

Referring to FIG. 4, the encoder 30 may include a first counter 80 responsive to a signal CLK with a frequency $F_{count}=20 \cdot F_c$. The rising edge 64 that begins the period $T_{P70}$ of the EAR signal 54 enables the counter 80, which starts at zero and increments a first count value by one each period of CLK. In response to the falling edge 66 that ends the period $T_{P70}$, a parallel-to-serial converter 82 latches the first count value from the counter 80, and thereafter serially outputs the latched count value to generate the digital value ("10" in this example) 84 of the bit stream 58. Although not shown, the signal CLK may clock the converter 82, or another signal may clock the converter 82 in a conventional manner. Furthermore, although shown as a decimal value "10" in FIG. 3E, the counter 80 may generate the digital value 84 as a binary value "1010".

The encoder 30 may also include a second counter 86 also responsive to CLK. The falling edge 66 that ends the period $T_{P70}$ and begins the period $T_{P74}$ of the EAR signal 54 enables the counter 86, which starts at zero and increments a second count value by one each period of CLK. In response to the rising edge 64 that ends the period $T_{P74}$, the parallel-to-serial converter 82 latches the second count value from the counter 86, and thereafter serially outputs the latched count value to generate the digital value ("5" in this example) 90 of the bit stream 58. Although shown as a decimal value "5" in FIG. 3E, the counter 80 may generate the digital value 90 as a binary value "0101".

Referring to FIG. 3E, in the stream 58, the digital values 84 and 90 may not inherently indicate the phase of the EAR signal 54. But this may be suitable in many applications, because although this may cause a phase shift of 180° in the reconstituted audio signal and in the resulting acoustic signal, such a phase shift may not cause noticeable distortion or other degradation of the resulting acoustic signal. Furthermore, the encoder 30 of FIG. 4 may include additional conventional components and couplings that are omitted for brevity.

In contrast referring to FIGS. 3C, 3F, and 4, in an embodiment, each digital value in the stream 60 includes a signed number that indicates the length of the period $T_P$ between each consecutive pair of edges 64 and 66 of the EAR signal 54, and that includes the level of the EAR signal during this period; consequently, the digital values that compose the stream 60 retain the phase of the EAR signal.

Referring to FIG. 4, to generate the system 60, the encoder 30 operates in a manner similar to that described above in conjunction with FIG. 3E, but the parallel-to-serial converter 82 includes an optional sign input node 100 that receives the EAR signal 54. For example, for the period $T_{P70}$ of the EAR signal 54, the converter 82 may add a logic 1 to the digital number 102 to indicate that during this period, the EAR signal has a level $V_H$ i.e., a positive ("+") phase. Conversely, during the period $T_{P74}$, the converter 82 may add a logic 0 to the digital number 104 to indicate that the EAR signal has a level $V_L$, i.e., a negative ("−") phase.

Referring to FIGS. 3D-4, a comparison of the number of bits in the streams 56, 58, and 60 is discussed. For purposes of example, the carrier frequency $F_c$ used to generate the EAR signal 54 of FIG. 3C is 1 MHz, and the frequency of the signal CLK of the encoder 30 of FIG. 4 and of the digital storage device 24 is 20 MHz. Therefore, $T_c=1$ us, and $T_{clk}=50$ ns. Because the average period $T_P$ of the EAR signal 54 is equal to $T_c/2$, then the average number of periods of the CLK signal per period $T_P$ is ten. Therefore, for the stream 56, there are an average of ten bits per 0.5 us, or 20 MB/s. For the stream 58, there are also ten periods of CLK per period $T_P$. But if the number of periods of CLK is compressed by encoding it as a binary number, then there are an average of only four bits per 0.5 us, or only 8 MB/s. And for the stream 60, the sign bit adds an extra bit to each digital value as compared to the digital values of the stream 58, so there are an average of five bits per 0.5 us, or 10 MB/s. Of course the average number of bits per second may vary as the carrier and CLK frequencies vary.

Referring to FIGS. 2, and 3D-4 the audio system 20 of FIG. 2 may be more immune to distortion from jitter in the EAR signal 54 and in the encoder clock CLK (if the encoder 30 is present) than sampled-amplitude audio systems. For example, a falling edge 66 of the EAR signal 54 may fall anywhere within a corresponding period of CLK without causing any error. In the above example where $T_{clk}=50$ ns, this leaves a window of approximately 25 ns in which the edge 66 may fall without introducing any jitter error. In contrast, for a sampled-amplitude audio system, because the amplitude is sampled, any sampling—clock jitter, no matter how small, may introduce an error.

Referring to FIGS. 3A-4, alternate embodiments of the above-described digitizing techniques are discussed. For example, although the audio and carrier signals are disclosed as being a sinusoid, these signals may have other forms such as a square wave. Furthermore, Huffman coding or other compression techniques may be used to reduce the number of bits per second in the steams 56, 58, and 60. For example, referring, e.g., to FIG. 3E, because the average of the digital values in the stream 58 equals $F_{clk}/(F_c \cdot 2)$ (the average is ten in the example of FIG. 3E), the decoder 22 of FIG. 2 may subtract this average from each digital value in the stream 58 before the resulting values are stored in the device 24 (FIG. 2). This may reduce the number of bits needed to represent each digital value, particularly where the average is greater than the differences between the average and the maximum and minimum values. Moreover, although disclosed as being composed of bits, the streams 56, 59, and 60 may be composed of digits having bases other than two. In addition, although described as voltage signals, the audio signal 50, modulated 52, and EAR signal 54 may be current signals. Furthermore, one may encrypt the EAR signal 54 by, e.g. varying the carrier frequency $F_c$ according to a particular "carrier-frequency signature", and then providing this "signature" only to authorized audio players. Moreover, although digitizing an analog audio signal is discussed, the above-described techniques may be used to digitize other types of analog signals in other frequency ranges. In addition, the audio signal 50 may be any type of audio signal, for example L, R, L+R, or L-R in a stereo system. Consequently multiple audio signals may be digitized per above, and a single resulting acoustic signal may be generated from a combination of audio signals respectively reconstituted from these digitized audio signals.

Figure 5:
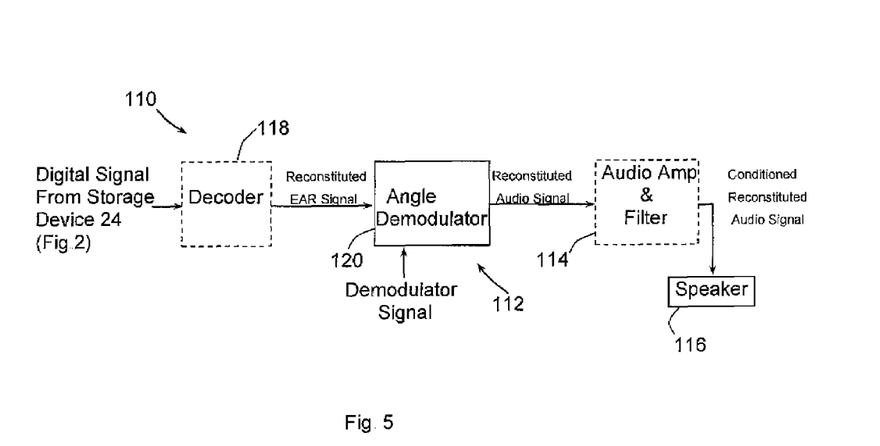
FIG. 5 is a schematic block diagram of an audio playback system for reconstituting an analog audio signal from a digital audio signal generated by the system of FIG. 2 according to an embodiment of the invention.

FIG. 5 is a schematic block diagram of an audio system 110 for reconstituting an analog audio signal from a digital audio signal generated, for example, by the digitizing audio system 20 of FIG. 2, and for generating from the reconstituted audio signal a resulting acoustic signal according to an embodiment of the invention.

The system 110 includes a reconstituting circuit 112, an optional audio amplifier and filter 114, and a transducer 116 such as a speaker.

The reconstituting circuit 112 includes an optional decoder 118 and an angle demodulator 120.

The decoder 118, when present, decodes the stream of stored digital values from a digital storage device such as the digital device 24 (FIG. 2) to reconstitute an EAR signal such as the EAR signal 54 (FIG. 3C). In an embodiment, the decoder 118 effectively reverses the coding applied by the encoder 30 of FIG. 2. For example, if the digital device 24 provides the stream 60 of FIG. 3F, then the decoder 118 generates a reconstituted EAR signal having the polarity and periods $T_P$ corresponding to the digital values that compose the stream. Alternatively, if the digital device 24 provides the stream 56 of FIG. 3D, and the voltage levels of the stream 56 are compatible with the angle demodulator 120, then the decoder 118 may be omitted. Or, if the voltage levels of the stream 56 are incompatible with the angle demodulator 120, then the decoder 118 may act as a level shifter that converts the voltage levels of the stream 56 into respective voltage levels that are compatible with the angle demodulator. Furthermore, if the encoder 30 subtracts a constant value (e.g., half the period of the carrier signal) from the digital values in the stream, e.g., the stream 58 of FIG. 3E, to reduce the number of bits in the stream, then the decoder 118 may add this constant value back to the stored digital values to generate resulting digital values that the decoder uses to generate the EAR signal. This constant value may be part of the stream.

The angle demodulator 120 demodulates the reconstituted EAR signal from the decoder 118 (or from the storage device 24 if the decoder is omitted) to generate a reconstituted audio signal. The demodulator 120 receives a demodulating signal that is of the same type and has the same phase (relative to the reconstituted EAR signal) and frequency as the carrier signal input to (or inherent in) the modulator (e.g., the modulator 26 of FIG. 2) used to generate the modulated signal from which the original EAR signal was generated. The demodulator 120 effectively reverses the modulation applied to the original audio signal (e.g., the audio signal 52 of FIG. 3A) by the modulator. For example, if the modulator is an FM modulator, then the demodulator 120 is an FM demodulator.

The optional audio amplifier and filter 114 conditions the reconstituted audio signal from the demodulator 120 for the speaker 116.

The speaker 116 converts the conditioned reconstituted audio signal from the amplifier and filter 114 (or the reconstituted audio signal from the demodulator 120 when the amplifier and filter are omitted) into a resulting acoustic signal.

Referring to FIG. 5, alternate embodiments of the audio system 110 are contemplated. For example, the audio system 110 may be combined with the audio system 20 (FIG. 2) into a single system that can digitize analog audio signals, reconstitute audio signals, and generate resulting acoustic signals from the reconstituted audio signals. Furthermore, although only one speaker 116 is shown, the system 110 may include multiple speakers. Moreover, if during digitizing of the audio signal by the circuit 20 of FIG. 2 the carrier frequency varies according to a frequency signature, then the frequency of the demodulating signal may also vary according to the frequency signature. The system 110 may receive the frequency signature via any suitable means.

Figure 6:
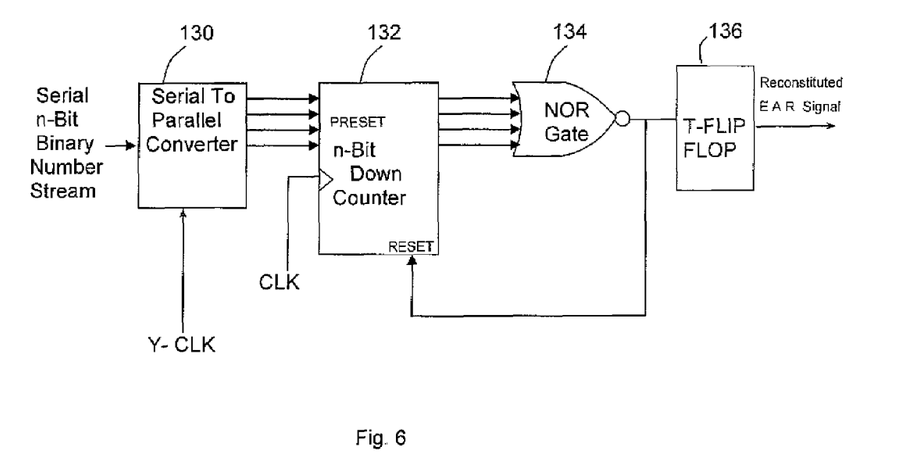
FIG. 6 is a schematic diagram of the decoder of FIG. 5 according to an embodiment of the invention.

FIG. 6 is a schematic diagram of the decoder 118 of FIG. 5 according to an embodiment of the invention. The encoder 118 includes a serial-to-parallel converter 130, a down counter 132, a NOR gate 134, and a T(toggle) flip-flop 136.

Figure 7:
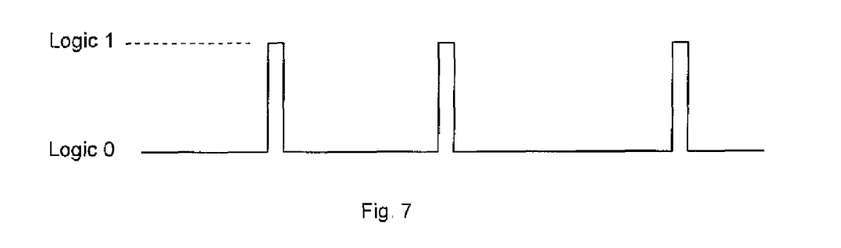
FIG. 7 is a timing diagram of a signal at an output node of the NOR gate of FIG. 6 according to an embodiment of the invention.

FIG. 7 is a timing diagram of the signal at the output of the NOR gate 134 of FIG. 6 according to an embodiment of the invention.

Referring to FIGS. 6 and 7, the operation of the decoder 118 is discussed according to an embodiment of the invention.

The converter 130 converts the serial data stream (e.g., the data stream 58 of FIG. 3E) from a storage device (e.g., the storage device 24 of FIG. 24) into digital values having a predetermined width of y, for example y=4 bits. The converter 130 also receives a clock signal having a frequency that is y times the frequency of a signal CLK.

The down counter 132 receives the y-bit values from the converter 130 in parallel, and loads these values in response to a RESET signal, which is the signal output from the NOR gate 134. After loading a value, the counter 132 begins decrementing this loaded count value by one each period of the signal CLK. For example, where the encoder (e.g., the encoder 30 of FIG. 2) is a counter as discussed above in conjunction with FIGS. 3E-3F, then CLK has the same frequency as the clock for the encoder.

The NOR gate 134 receives the count value from the down counter 132, and generates at its output a logic 0 for all count values other than zero as shown in FIG. 7. When the count value reaches zero, then the NOR gate 134 generates a logic 1 as shown in FIG. 7. In response to the logic 1 at its reset input, the down counter 132 loads the next count value from the converter 130, and this causes the NOR gate 134 to again generate a logic 0 at its output. Therefore, as shown in FIG. 7, the NOR gate 134 generates a pulse in response to the count reaching zero, and the pulse width approximately equals the time between the count reaching zero and the counter 132 loading the next count value. This loading may occur fast enough so that the counter 132 begins counting down again on the active edge of CLK following the edge that caused the count value to reach zero.

In response to the pulse generated by the NOR gate 134, the T flip-flop 136 toggles its output from one of two voltage levels, e.g., $V_H$ and $V_L$, to the other of the two voltage levels to generate a reconstituted EAR signal. Although not shown, the T-flip flop 136 may be modified to receive a phase signal from the converter 130 so that the reconstituted EAR signal has the same phase as the original EAR signal (e.g., the EAR signal 54 of FIG. 3C). The converter 130 may generate the phase signal from, e.g., a phase bit included in the data stream as discussed above in conjunction with FIG. 3E.

Figure 8:
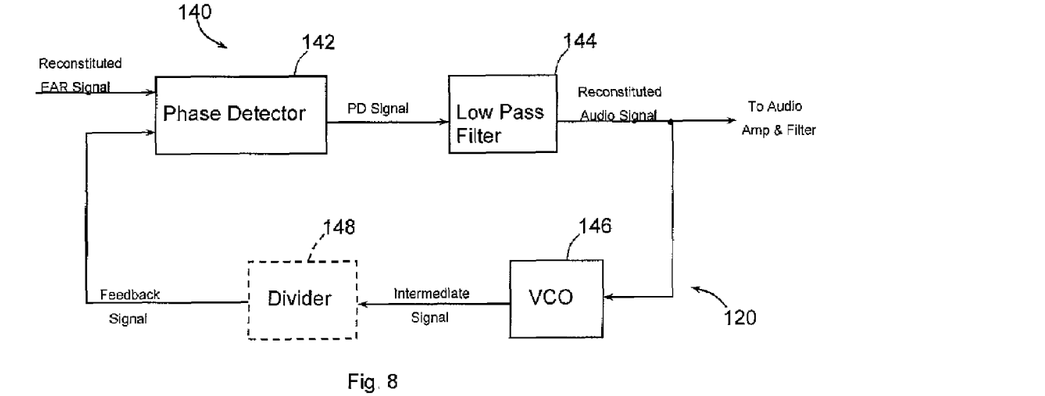
FIG. 8 is a schematic block diagram of the demodulator of FIG. 5 according to an embodiment of the invention.

FIG. 8 is a block diagram of the angle demodulator 120 of FIG. 5 according to an embodiment of the invention where the angle demodulator includes an FM demodulator.

The angle demodulator 120 includes a phase-locked loop (PLL) 140, which operates as a frequency demodulator. The PLL 140 includes a conventional phase detector 142, a conventional low-pass filter 144, a conventional VCO 146, and an optional conventional frequency divider 148. Because the VCO effectively generates the demodulating frequency (for example, the center frequency of the VCO may be the demodulating frequency as discussed below), in this embodiment the angle demodulator 120 need not receive a separate demodulating frequency.

The phase-detector 142 compares the phase of the reconstituted EAR signal to a feedback signal, and generates a phase-difference (PD) signal having a first logic value if the phase of the reconstituted EAR signal leads the phase of the feedback signal, and having a second logic value if the phase of the reconstituted EAR signal lags the phase of the feedback signal.

The low-pass filter 144 filters the PD signal to generate the reconstituted audio signal. In an embodiment, the filter 144 also conditions the reconstituted audio signal sufficiently to allow the omission of the audio amplifier and filter circuit 114 of FIG. 5.

The VCO 146 generates, in response to the reconstituted audio signal, an intermediate signal having a frequency that is linearly proportional the amplitude of the reconstituted audio signal. For example, the intermediate signal may be a square wave.

The optional divider 148 converts the intermediate signal from the VCO 146 into the feedback signal. The divider allows the center frequency of the VCO 146 to be unequal to the frequency of the carrier signal used to generate the original EAR signal. For example, if the center frequency of the VCO 146 is ten times the frequency of the carrier frequency, then the divider 148 divides the frequency of the intermediate signal by ten. Alternatively, if the center frequency of the VCO 146 equals the carrier frequency, then the divider 148 may be omitted, and the VCO generates the feedback signal directly.

Figure 9:
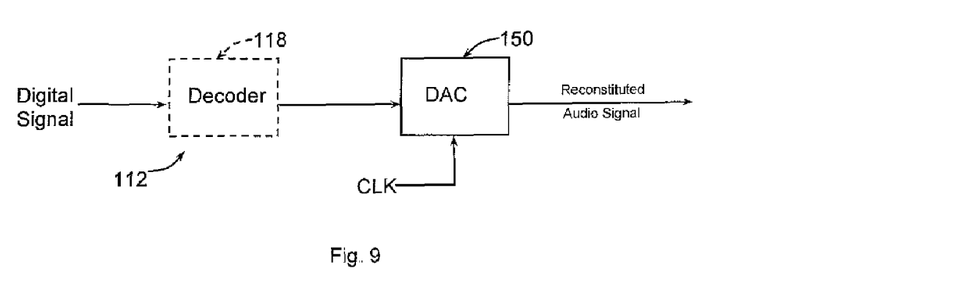
FIG. 9 is a schematic block diagram of the reconstituting circuit of FIG. 5 according to an embodiment of the invention.

FIG. 9 is a schematic block diagram of the reconstituting circuit 112 of FIG. 5 according to another embodiment of the invention in which the original EAR signal (e.g., the EAR signal 52 of FIG. 3C) is the result of frequency modulation.

The decoder 118 generates a stream of digital values that each represent the length of a corresponding period $T_P$ of the original EAR signal. For example, the decoder 118 may reconstitute the data stream 58 or 60 of FIGS. 3E-3F. Therefore, in this embodiment, the decoder 118 does not reconstitute the EAR signal, but reconstitutes only a data stream that represents the EAR signal.

The angle demodulator 120 includes a DAC 150, which converts the digital values from the decoder 118 into the reconstituted audio signal in response to a signal CLK having a frequency that is twice the frequency of the carrier signal used to generate the original EAR signal via frequency modulation.

The theory of demodulation using the DAC 150 is as follows. As discussed above in conjunction with FIGS. 3C and 3E-3F, the lengths of the periods $T_P$ of the original EAR (e.g., the original EAR signal 54) are linearly and inversely proportional to the amplitude of the original audio signal (e.g., the audio signal 50 of FIG. 3A); consequently, the digital values in the data stream (e.g., the stream 58 or 60) are also linearly and inversely proportional to the amplitude of the original audio signal. Therefore, converting the values in the reconstituted data stream (e.g., a reconstituted version of the stream 58 or 60) directly into respective amplitudes reconstitutes the original audio signal, or at least an approximation of the original audio signal that may be suitable for at least some applications. Because larger numbers in the reconstituted data stream indicate lower amplitudes and smaller numbers indicate higher amplitudes, the DAC 150, which may generate larger amplitudes for larger numbers and lower amplitudes for smaller numbers, may generate the reconstituted audio signal having a phase shift of 180° relative to the original audio signal. But as discussed above, this phase shift may be imperceivable to the human ear. Alternatively, the decoder 118, the DAC 150, or another component of the reconstituting circuit 112 may perform a phase inversion to reduce or eliminate this phase shift or the phase inversion may be performed by the circuit 20 of FIG. 2.

Referring to FIG. 5, although reconstituting an analog audio signal from a digital audio signal is discussed, the system 110 may reconstitute other types of analog signals from other types of digital signals.

Furthermore, referring to FIGS. 2 and 5, the audio system 20 and 110 may be made compatible with any audio technique such as stereo recording.

The preceding discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

What is claimed is:

1. An audio-signal digitizer, comprising:
a modulator operable to receive an analog audio signal, to angle modulate a carrier signal having a frequency with the audio signal, and to vary the frequency of the carrier signal independently of the modulation so as to generate a modulated analog signal having an average amplitude; and
a converter coupled to the modulator and operable to convert the modulated signal into a digital signal having a first level in response to the output signal having an amplitude larger than approximately the average amplitude, and having a second level in response to the output signal having an amplitude smaller than approximately the average amplitude.

2. The audio-signal digitizer of claim 1 wherein the modulator is operable to angle modulate the carrier signal by phase modulating the carrier signal with the analog audio signal.

3. The audio-signal digitizer of claim 1 wherein the modulator is operable to angle modulate the carrier signal by frequency modulating the carrier signal with the analog audio signal.

4. The audio-signal digitizer of claim 1 wherein the converter comprises a comparator having:
a first input node operable to receive the modulated signal;
a second input node operable to receive a reference signal that is approximately equal to the average amplitude of the modulated signal; and
an output node operable to provide the digital signal.

5. The audio-signal digitizer of claim 1 wherein the average amplitude is approximately zero.

6. The audio-signal digitizer of claim 1, further comprising a coder coupled to the converter and operable:
to generate a respective first number representing a duration of each first portion of the digital signal having the first level; and
to generate a respective second number representing a duration of each second portion of the digital signal having the second level.

7. The audio-signal digitizer of claim 1, further comprising a coder coupled to the converter and operable:
to generate a respective first number representing a duration of each first portion of the digital signal having the first level;
to generate a respective second number representing a duration of each second portion of the digital signal having the second level; and
to generate a stream of the first numbers interleaved with the second numbers.

8. The audio-signal digitizer of claim 1, further comprising a coder coupled to the converter and operable:
to generate a respective first number representing a duration of each first portion of the digital signal having the first level;
to generate a respective second number representing a duration of each second portion of the digital signal having the second level;
combining each first number and second number with a third number.

9. The audio-signal digitizer of claim 8 wherein:
the carrier signal has a period that varies with the frequency of the carrier signal; and
the third number represents half of the period of the carrier signal and varies with the period.

10. The audio-signal digitizer of claim 8 wherein the third number equals a lowest one of the first and second numbers.

11. The audio-signal digitizer of claim 8 wherein:
the first level comprises a first voltage level; and
the second level comprises a second voltage level.

12. The audio-signal digitizer of claim 8 wherein:
the first level corresponds to a first logic value; and
the second level corresponds to a second logic value.

13. The audio-signal digitizer of claim 1 wherein the modulator is operable to receive the carrier signal.

14. The audio-signal digitizer of claim 1 wherein the modulator is operable to vary the frequency of the carrier signal according to a signature.

15. The audio-signal digitizer of claim 1 wherein the modulator is operable to vary the frequency of the carrier signal according to a predictable signature.

16. The audio-signal digitizer of claim 1 wherein the modulator is operable to vary the frequency of the carrier signal according to a periodic signature.

17. A system, comprising:
a modulator operable to receive an analog audio signal, to angle modulate a carrier signal having a frequency with the analog audio signal, and to vary the frequency of the carrier signal according to a carrier-frequency signature so as to generate an encrypted modulated signal having an average amplitude;
a converter coupled to the modulator and operable to convert the modulated signal into a digital signal having a first level in response to the modulated signal having an amplitude larger than approximately the average amplitude, and having a second level in response to the modulated signal having an amplitude smaller than approximately the average amplitude; and
a storage device coupled to the converter and operable to store the digital signal.

18. The system of claim 17 wherein the storage device comprises a storage medium, the storage device further operable:
to store in a respective first segment of the storage medium, for each first portion of the digital signal having the first level, a first value corresponding to the first level, the first segment having a first dimension corresponding to a duration of the first portion; and
to store in a respective second segment of the storage medium, for each second portion of the digital signal having the second level, a second value corresponding to the second level, the second segment having a second dimension corresponding to a duration of the second portion.

19. The system of claim 18 wherein:
the first dimension comprises a length of the first segment; and
the second dimension comprises a length of the second segment.

20. The system of claim 17, further comprising:
a coder coupled to the converter and operable to generate a respective first number representing a duration of each first portion of the digital signal having the first level, and to generate a respective second number representing a duration of each second portion of the digital signal having the second level; and wherein the storage device is operable to store the first and second numbers in the sequence generated.

21. The system of claim 17, further comprising:

a coder coupled to the converter and operable to generate a respective first number representing the first level and a duration of each first portion of the digital signal having the first level, and to generate a respective second number representing the second level and a duration of each second portion of the digital signal having the second level; and wherein the storage device is operable to store the first and second numbers in the sequence generated.

22. The system of claim 17, wherein the storage device is operable to store the signature.

23. A method, comprising:

generating a modulated signal having an instantaneous amplitude and an average amplitude by angle modulating a carrier signal having a frequency with an analog audio signal and varying the frequency of the carrier signal according to a signature; and generating a digital signal having edges corresponding to times at which the instantaneous amplitude of the modulated signal approximately equals the average amplitude.

24. The method of claim 23, further comprising:

generating a respective first number representing a respective first period between each pair of consecutive edges of the digital signal during which the instantaneous amplitude of the modulated signal has a first polarity relative to the average amplitude; and generating a respective second number representing a respective second period between each pair of consecutive edges of the digital signal during which the instantaneous amplitude of the modulated signal has a second polarity relative to the average amplitude.

25. The method of claim 23, further comprising:

generating a respective first number representing a respective first period between each pair of consecutive edges of the digital signal during which the instantaneous amplitude of the modulated signal has a first polarity relative to the average amplitude;

generating a respective second number representing a respective second period between each pair of consecutive edges of the digital signal during which the instantaneous amplitude of the modulated signal has a second polarity relative to the average amplitude; and generating a stream of the first and second numbers in an order in which the first and second numbers are generated.

26. The method of claim 23, further comprising:

generating a respective first number representing a respective first period between each pair of consecutive edges of the digital signal during which the instantaneous amplitude of the modulated signal has a first polarity relative to the average amplitude;

generating a respective second number representing a respective second period between each pair of consecutive edges of the digital signal during which the instantaneous amplitude of the modulated signal has a second polarity relative to the average amplitude; and subtracting a third number from each first number and second number.

27. The method of claim 23, further comprising:

storing a respective first number of occurrences of a first value, each first number representing a duration of a respective first period between each pair of consecutive edges of the digital signal during which the instantaneous amplitude of the modulated signal has a first polarity relative to the average amplitude; and storing a respective second number of occurrences of a second value, each second number representing a duration of a respective second period between each pair of consecutive edges of the digital signal during which the instantaneous amplitude of the modulated signal has a second polarity relative to the average amplitude.

28. The method of claim 23, further comprising:

storing a first value along respective first distances of a storage medium, each first distance representing a duration of a respective first period between each pair of consecutive edges of the digital signal during which the instantaneous amplitude of the modulated signal has a first polarity relative to the average amplitude; and storing a second value along respective second distances of the storage medium, each second distance representing a duration of a respective second period between each pair of consecutive edges of the digital signal during which the instantaneous amplitude of the modulated signal has a second polarity relative to the average amplitude.

29. A reconstituted audio-signal digitizer, comprising:

a signal node operable to receive a digital signal having a first level during respective first periods and having a second level during respective second periods, the first periods having respective first durations and the second periods having respective second durations; and a demodulator coupled to the signal node and operable to angularly demodulate the digital signal with a demodulation signal having a frequency that varies according to a signature so as to generate an analog audio signal having an instantaneous amplitude corresponding to the first and second durations.

30. The audio-signal digitizer of claim 29 wherein the demodulator is operable to demodulate the digital signal by phase demodulating the digital signal.

31. The audio-signal digitizer of claim 29 wherein the demodulator is operable to demodulate the digital signal by frequency demodulating the digital signal.

32. The audio-signal digitizer of claim 29, further comprising a decoder coupled to the signal node and operable:

to receive a stream of first numbers and second numbers;

to generate the first periods of the digital signal in response to the first numbers, the first duration of each first period corresponding to a respective one of the first numbers; and to generate the second periods of the digital signal in response to the second numbers, the second duration of each second period corresponding to a respective one of the second numbers.

33. The audio-signal digitizer of claim 29, further comprising a decoder coupled to the signal node and operable:

to receive a stream of first numbers and second numbers;

to add a third number to each of the first and second numbers to generate respective modified first and second numbers;

to generate the first periods of the digital signal in response to the modified first numbers, the first duration of each first period corresponding to a respective one of the modified first numbers; and to generate the second periods of the digital signal in response to the modified second numbers, the second duration of each second period corresponding to a respective one of the modified second numbers.

34. The audio-signal digitizer of claim 33 wherein the third number represents half of a period of the demodulation signal.

35. The audio-signal digitizer of claim 29 wherein:
the first level comprises a first voltage level; and
the second level comprises a second voltage level.

36. An audio system, comprising:
a storage device operable to store information describing first and second durations of respective first and second signal levels that compose an angle-modulated digital signal; and
a demodulator coupled to the storage device, including a digital-to-analog converter, and operable to angularly demodulate the digital signal by directly converting with the digital-to-analog converter first and second digital values that represent the first and second durations into an analog audio signal having an instantaneous amplitude corresponding to the first and second durations.

37. The system of claim 36 wherein the storage device comprises a storage medium, the storage device further operable:
to store in a respective first segment of the storage medium, for each first portion of the digital signal having the first level, a first value corresponding to the first level, the first segment having a first dimension corresponding to a duration of the first portion; and
to store in a respective second segment of the storage medium, for each second portion of the digital signal having the second level, a second value corresponding to the second level, the second segment having a second dimension corresponding to a duration of the second portion.

38. The system of claim 37 wherein:
the first dimension comprises a length of the first segment; and
the second dimension comprises a length of the second segment.

39. The system of claim 36 wherein the storage device comprises a storage medium, the storage device further operable:
to store in the storage medium, for each first portion of the digital signal having the first level, a first value corresponding to the first level and a second value corresponding to a duration of the first portion; and
to store in the storage medium, for each second portion of the digital signal having the second level, a third value corresponding to the second level and a fourth value corresponding to a duration of the second portion.

40. The system of claim 36 wherein the storage device comprises a storage medium, the storage device further operable:
to store in the storage medium, for each first portion of the digital signal having the first level, a first value corresponding to the first level and to a duration of the first portion; and
to store in the storage medium, for each second portion of the digital signal having the second level, a second value corresponding to the second level and to a duration of the second portion.

41. The system of claim 36, further comprising a decoder coupled between the storage device and the demodulator and operable to generate the digital values respectively equal to the first and second durations.

42. A method, comprising:
receiving a digital signal having edges; and
angularly demodulating the digital signal with a demodulation signal having a frequency that varies substantially according to a signature of a varying carrier frequency that was angularly modulated to generate the digital signal so as to generate an analog audio signal having an instantaneous amplitude corresponding to durations between consecutive edges of the digital signal.

43. The method of claim 42, further comprising:
receiving a sequence of numbers; and
generating the digital signal by generating consecutive edges of the digital signal separated by durations each corresponding to a respective number in the sequence.

44. The method of claim 42 wherein angularly demodulating the digital signal comprises frequency demodulating the digital signal.

45. The method of claim 42, further comprising receiving the signature.

46. A method, comprising:
receiving a sequence of numbers that represent first and second periods during which a digital signal has respective first and second levels, the digital signal representing a carrier signal angularly modulated with an analog audio signal; and
directly converting the sequence of numbers into a reconstituted analog audio signal having an amplitude corresponding to the numbers.

47. The method of claim 46 wherein directly converting the sequence of numbers into the reconstituted analog audio signal comprises directly converting the sequence of numbers into the reconstituted analog audio signal with a digital-to-analog converter.

48. The method of claim 46, further comprising driving a speaker with the reconstituted analog audio signal.

* * * * *